United States Patent [19]

Hasbun et al.

[11] Patent Number: 5,563,828
[45] Date of Patent: Oct. 8, 1996

[54] METHOD AND APPARATUS FOR SEARCHING FOR DATA IN MULTI-BIT FLASH EEPROM MEMORY ARRAYS

[75] Inventors: Robert Hasbun, Shingle Springs; Geoff Gould, El Dorado Hills, both of Calif.

[73] Assignee: Intel Corporation, Santa Clara, Calif.

[21] Appl. No.: 364,619

[22] Filed: Dec. 27, 1994

[51] Int. Cl.$^6$ .................................................. G11C 13/00
[52] U.S. Cl. ............................... 365/185.33; 365/218
[58] Field of Search .............................. 365/45, 900, 218, 365/185.33

[56] References Cited

U.S. PATENT DOCUMENTS

| | | |
|---|---|---|
| 3,648,255 | 3/1972 | Beausoleil et al. . |
| 3,729,712 | 4/1973 | Glassman . |
| 4,528,624 | 7/1985 | Kamionka et al. . |
| 4,642,759 | 2/1987 | Foster . |
| 4,644,494 | 2/1987 | Muller . |
| 4,758,944 | 7/1988 | Bartley et al. . |
| 4,763,305 | 8/1988 | Kuo . |
| 4,802,117 | 1/1989 | Chrosny et al. . |
| 4,896,262 | 1/1990 | Wayama et al. . |
| 4,958,315 | 9/1990 | Balch . |
| 5,012,425 | 4/1991 | Brown . |
| 5,070,474 | 12/1991 | Tuma et al. . |
| 5,101,490 | 3/1992 | Getson, Jr. et al. . |
| 5,111,385 | 5/1992 | Hattori . |
| 5,131,089 | 7/1992 | Cole . |
| 5,199,033 | 3/1993 | McGeoch et al. . |
| 5,200,959 | 4/1993 | Gross et al. . |
| 5,237,673 | 8/1993 | Orbits et al. . |
| 5,339,411 | 8/1994 | Heaton, Jr. . |
| 5,341,339 | 8/1994 | Well ........................ 365/218 |

FOREIGN PATENT DOCUMENTS

| | | |
|---|---|---|
| 2088442 | 7/1993 | Canada . |
| 0175458A2 | 3/1986 | European Pat. Off. . |
| 0392895A2 | 10/1990 | European Pat. Off. . |
| 2251324 | 7/1992 | United Kingdom . |
| 2251323 | 7/1992 | United Kingdom . |

OTHER PUBLICATIONS

Auclair, Dan, "Optimal Solid State Disk Architecture for Portable Computers", Proceedings of Silicon Valley P.C. Design Conference, Jul. 9, 1991, pp. 811–815.

Gross, Stephen J. and Jorge–Luis Sanchez, "Solid–State Mass Storage Arrives", Product Feature, Memory Card Systems & Design, Jul./Aug. 1992.

Robinson, Kurt, "Trends in Flash Memory System Design", Wescon Conference Record, Nov. 1990, pp. 468–472.

*Primary Examiner*—Terrell W. Fears
*Attorney, Agent, or Firm*—Blakely, Sokoloff, Taylor & Zafman

[57] ABSTRACT

An arrangement which provides for searching for a data pattern in a flash EEPROM memory array using the internal controllers of the individual chips of the array. By utilizing these controllers to conduct the search, an external database is not required to store all of the logical addresses and their associated physical positions. The addition of more memory to the array need not increase the time required for the search because each addition of a chip to the array to add more memory adds another controller as well as more memory. In fact, the time for conducting the search may be reduced since searches may be conducted in parallel on the individual chips. The direct on-chip search of the array requires a much smaller general data base which is used essentially for control information and frees area on the flash EEPROM memory array board for memory devices.

23 Claims, 6 Drawing Sheets

METHOD AND APPARATUS FOR SEARCHING FOR DATA IN MULTI-BIT FLASH EEPROM MEMORY ARRAYS

BACKGROUND OF THE INVENTION

1. Field of the Invention

This invention relates to flash EEPROM memory arrays, and more particularly, to methods and apparatus for finding data stored in advanced flash EEPROM memory arrays.

2. History of the Prior Art

Recently, flash electrically-erasable programmable read only memory (flash EEPROM memory) has been used as a new form of long term storage. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. The memory transistors may be programmed by storing a charge on the floating gate. This charge remains when power is removed from the array. The charge level may be detected by interrogating the devices. Flash EEPROM memory arrays may be designed to provide a smaller lighter functional equivalent of a hard disk drive which operates more rapidly and is not as sensitive to physical damage. Flash EEPROM memory arrays are especially useful in portable computers where space is at a premium and weight is extremely important.

As originally devised, each flash EEPROM memory cell stores a single bit of data. If a flash EEPROM memory cell is programmed so that charge is stored on the floating gate, the state is typically referred to as a "zero" or programmed state; while if little or no charge is stored on the gate, this is typically considered a "one" or erased state. Recently, it has been discovered that the transistor devices used for flash EEPROM memory arrays may be made to store charge at a number of discrete levels greater than the charge level of the erased state. Essentially, a plurality of discrete levels of charge above the erased level may be stored on the floating gates of the devices during programming and erasing by varying the voltages applied to the terminals of the devices and the duration of application; and these different charge levels (device conditions or states) may be detected. This allows flash EEPROM memory arrays to store more than one bit per flash cell and radically increases the storage capacity of such arrays.

In general, a flash EEPROM memory array is divided into blocks which are connected so that each entire block of memory cells must be erased simultaneously. With N-type complimentary metal-oxide-silicon (CMOS) flash memory cells, this erasure is typically accomplished by a high voltage value applied simultaneously to the source terminals of all the memory transistors of the block while the gate terminals are grounded and the drain terminals are floated. Whether one or more bits are stored in a cell, since all of the source terminals of the memory transistors of a block of the array are joined together, a device having its floating gate in a charged state cannot be switched to the erased state without erasing all of the cells in the entire block of the array. Thus, while an electro-mechanical hard disk drive typically stores information in a first area of the disk and then rewrites that same area of the disk when the information changes, this is not possible with a flash memory array without erasing all of the valid information that remains in that portion of the array along with the invalid (dirty) information. Consequently, in a recently devised arrangement, when the information at a data entry changes, the changed information is written to a new location on a block of the array containing empty (erased) cells rather than written over the old data; and the old data is marked invalid.

Because of this arrangement by which data is replaced by writing it to a different physical position, the physical address at which data is stored varies constantly. Consequently, a logical address is assigned to and accompanies the data to indicate where specific data is stored.

There are a number of problems which arise from the storage of data in a flash EEPROM cell because of this logical addressing scheme. In order to find a physical location at which data is stored, it is necessary to conduct a search for the physical address. Heretofore, an address search has been conducted in a data base which is set up in memory on the flash EEPROM memory array board whenever power is applied to the array. This data base provides a lookup table in which logical and physical addresses are correlated. The search utilizes the flash system controller on the array board. The system controller conducts a lookup to find the logical address in this database whenever the array is accessed. With smaller flash memory arrays, this sort of search for data is feasible because the number of entries is relatively small. However, as the size of arrays has increased, the data base required for such an address search has increased as both the number of entries in the array and the length of each entry has increased until it occupies a very significant amount of the space available on the circuit board. Moreover, since a search of the array is conducted on a serial basis on power up in order to establish the data base initially, the time required for that search has increased as the size of the array has increased. With larger arrays, it has become impossible to finish the search before other requirements of the system cause the search to be discontinued. It has become apparent that the array suffers so greatly from the use of such an arrangement that products so devised are not feasible for large flash EEPROM memory arrays.

It is therefore desirable to provide an improved method and apparatus for conducting a data search in a flash EEPROM memory array.

SUMMARY OF THE INVENTION

It is, therefore, an object of the present invention to provide apparatus and methods for conducting a data search in a flash EEPROM memory array.

This and other objects of the present invention are realized in an arrangement which provides for searching for a data pattern in a flash EEPROM memory array using the internal controllers of the individual chips of the array. By utilizing these controllers to conduct the search, an external database is not required to store all of the logical addresses and their associated physical positions. Moreover, the addition of more memory to the array need not increase the time required for the search because each addition of a chip to the array to add more memory adds another controller as well as more memory. In fact, the time for conducting the search may be reduced since searches may be conducted in parallel on the individual chips. The direct on-chip search of the array requires a much smaller general data base which is used essentially for control information. This frees area on the flash EEPROM memory array board for additional memory devices.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
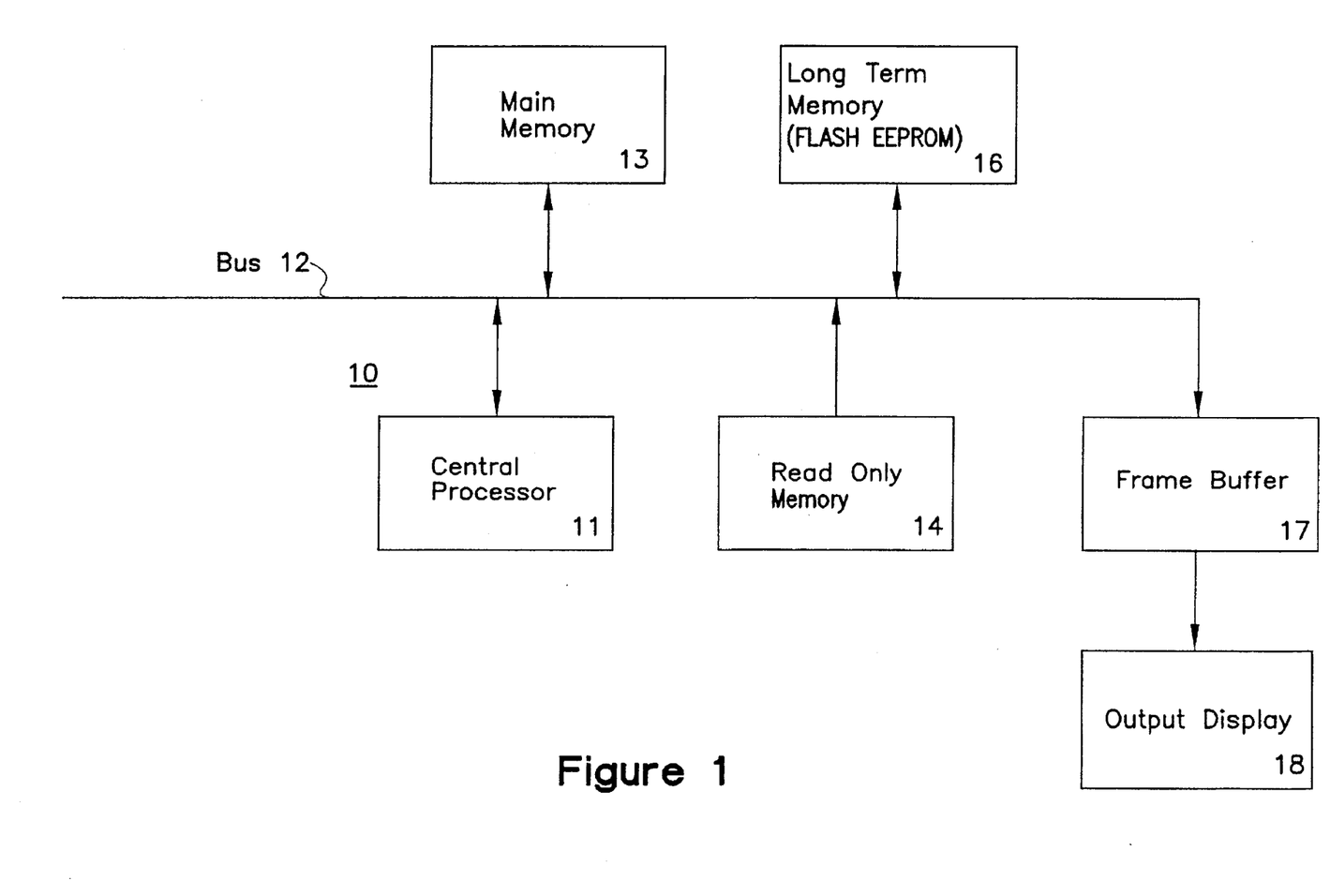
FIG. 1 is a block diagram of a computer system which may utilize the present invention.

Referring now to FIG. 1, there is illustrated a block diagram of a digital system 10 configured in accordance with one embodiment of the present invention. The present invention has application in any digital system utilizing flash EEPROM memory arrays, such as a computer system. The invention may also be used in digital systems which utilize other forms of memory (such as EPROM memory) the cells of which are capable of assuming more than two discrete states. A portion of such a system 10 includes a central processing unit 11 which executes the various instructions provided to control the operations of the system 10. The central processing unit 11 is joined to a bus 12 adapted to carry information between the various components of the system 10. Joined to the bus 12 is main memory 13 which is typically constructed of dynamic random access memory arranged in a manner well known to those skilled in the prior art to store information during a period in which power is provided to the system 10. In some systems, main memory 13 may be positioned on a processor bus (not shown) in order to provide faster access to memory by the central processing unit.

Also connected to the bus 12 are various peripheral components such as long term memory 16 and circuitry such as a frame buffer 17 to which data may be written which is to be transferred to an output device such as a monitor 18 for display. Rather than an electro-mechanical hard disk drive which is typically used for long term memory, a flash EEPROM memory array may be used as the long term memory 16. Such flash EEPROM memory arrays may be single-bit or multi-level memory systems (memory systems in which a memory array may store more than one bit per cell) and may include circuitry for controlling the operation of the memory array including all of the operations associated with reading, programming (writing), and erasing the memory array.

Figure 2:
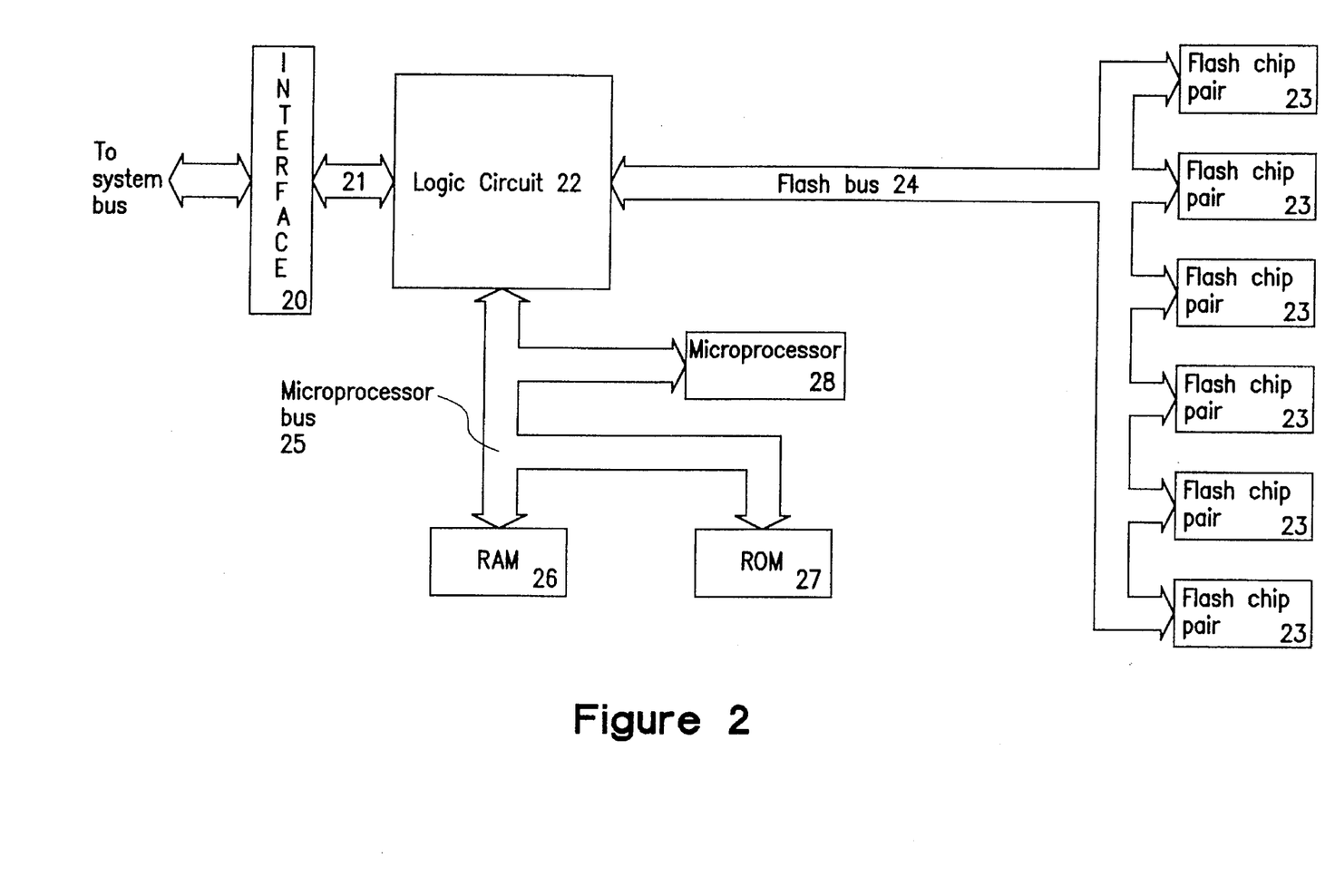
FIG. 2 is a block diagram of a flash EEPROM memory array constructed in accordance with the present invention.

FIG. 2 illustrates in block diagram form a memory system 16 such as that illustrated in FIG. 1. The memory system 16 is joined to the bus 12 through an interface 20. The interface 20 includes appropriate circuitry for providing signals furnished on the bus 12 to a flash system bus 21. The flash system bus 21 transfers signals between the interface 20 and a logic circuit 22. In one embodiment, this logic circuit 22 is an application specific integrated circuit (ASIC) which provides logic for implementing and coordinating the various operations of the flash memory system 16 such as reading, writing, erasing, and determining the status of the various portions of the flash EEPROM memory array. The logic circuit 22 functions as a command center and controls operations occurring in a plurality of flash EEPROM chip pairs 23 via a flash bus 24 so that those chips function together as a long term memory system. The logic circuit 22 is assisted in its operations by a microprocessor 28 which is associated on a microprocessor bus 25 with random access memory (RAM) 26, and read only memory (ROM) 27. In one embodiment the microprocessor 28 is an Intel 80188 microprocessor manufactured by Intel Corporation of Santa Clara, Calif. For the purposes of the present invention, the microprocessor 28, random access memory 26, and read only memory 27 function essentially as a general purpose processor in a manner well known to those skilled in the prior art. In order to carry out the functions of the flash EEPROM memory array, programs used in the various operations such as read, write, and erase may be stored in ROM 27 and executed by the microprocessor 28.

U.S. patent application Ser. No. 969,131, entitled A Method and Circuitry For A Solid State Memory Disk, Wells and Hasbun, filed Oct. 30, 1992, and assigned to the assignee of the present invention provides a further description of one arrangement for controlling the operation of a flash EEPROM memory array.

In one embodiment, each pair of flash EEPROM memory chips 23 includes thirty-two blocks of memory transistors.

Figure 3:
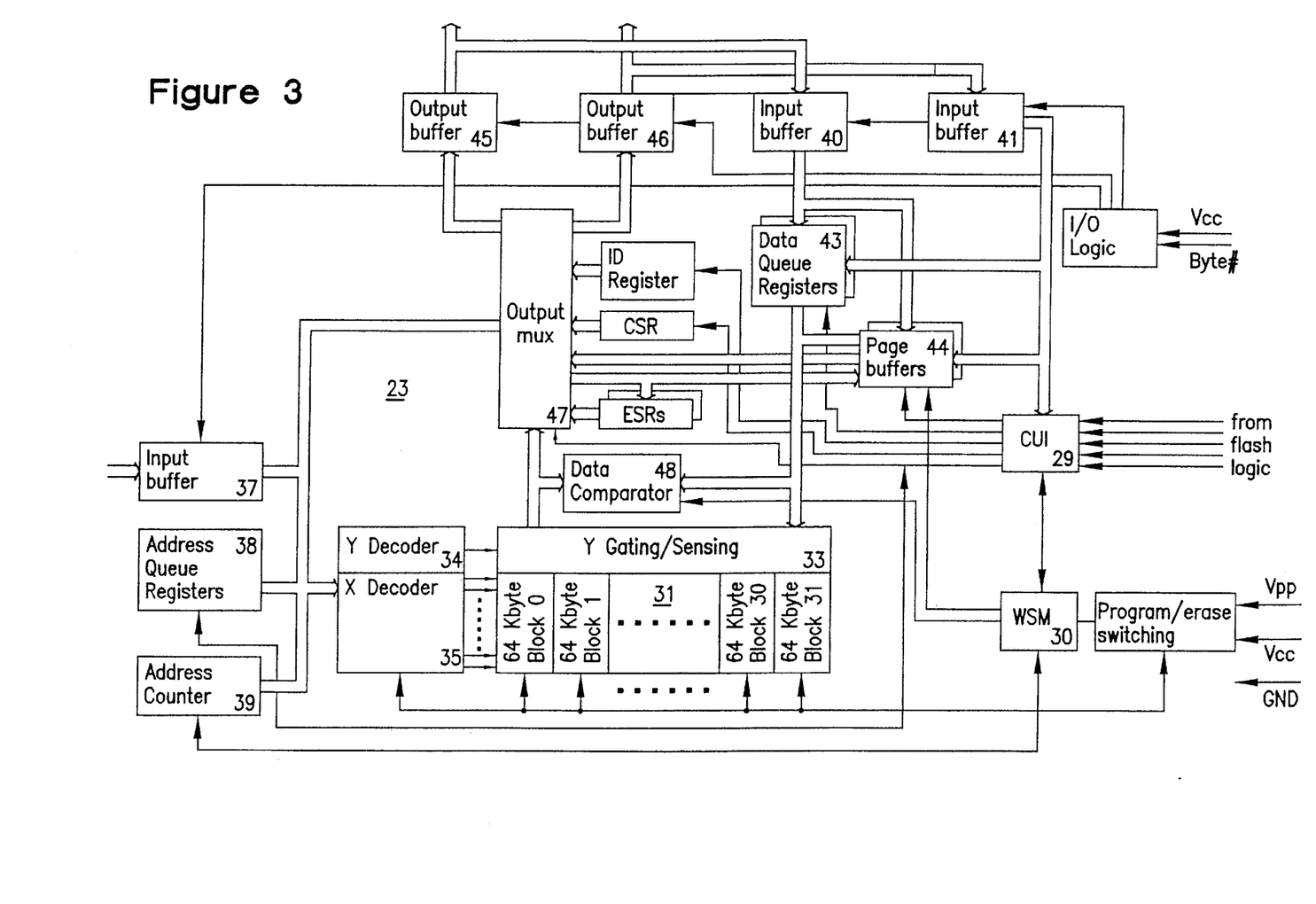
FIG. 3 is a block diagram illustrating a pair of memory chips and control circuitry used in the memory array illustrated in FIG. 2.

Each chip of a pair 23 includes one-half of the memory transistors of the thirty-two blocks and control circuitry for effecting, among other things, read, write, and erase operations in the individual memory cells of the blocks of that chip pair 23. As is illustrated in FIG. 3 which shows one pair of flash chips upon which thirty-two blocks of the array may be situated, each flash chip pair 23 is joined to the flash bus 24 by a command user interface (CUI) 29. The interface 29 controls the transfer of data between the memory system 16 and the individual chip pair 23. The user interface 29 receives commands from the logic circuit 22 of the flash system 16 generated as programs are run by the microprocessor 28 and provides command signals to the chip pair 23. The user interface 29 is associated with a write state machine 30 which is utilized to control write operations and certain internal operations of the chip pair 23. In one embodiment, the write state machine 30 includes a micro-controller including the typical registers, call stacks, program counter, and code and data storage areas to enable the execution of a number of commands which may be stored in the code storage area.

The chip pair 23 of FIG. 3 includes a flash EEPROM memory array 31 which in the embodiment illustrated includes thirty-two individual blocks each including sixty-four kilobytes of flash EEPROM memory cells. As is shown in the figure, the array 31 includes Y gating/sensing circuitry 33 for controlling the bitlines and output sensing devices of the array 31. Y decoder circuitry 34 furnishes address information to the Y gating/sensing circuitry 33, while X decoder circuitry 35 furnishes addresses used to select wordlines during flash memory accesses. Addresses are furnished to the flash chip pair 23 at an address input buffer 37 which with an address queue register 38 and an address counter 39 controls the transfer of addresses to the chip pair 23.

Data is furnished to the chip pair 23 at a pair of input buffers 40 and 41 from which it may be transferred to a data queue register 43 or to a pair of page buffers 44. Each of the data queue registers 43 and the page buffers 44 provides a direct path to the array 31 under control of the write state machine 30. The page buffers 44 allow relatively large amounts of data to be accumulated and then written to the array 31 more rapidly than would be possible using individual write operations. Data is read to the system from the array 31 through a pair of output buffers 45 and 46 using an output multiplexor 47 which is controlled by the command user interface 19. The multiplexor 47 also allows the transfer of various system information from the page buffers 44, from an ID register, and from various other internal circuitry such as status registers under control of the command user interface 29. The status registers (CSRs and ESRs in the figure) may be read to determine the status of an operation such as write or erase, whether the operation is complete, and whether it has been completed successfully. These status registers also provide information of the state of each chip, the state of each block in a chip, the state of the command queue, and the mode in which the chip is operating. A data comparator 48 includes circuitry which functions with the command user interface to compare addresses furnished with any command to the chip pair 23 and the addresses on each block of the chip pair so that a logical address may be rapidly accessed.

The command user interface 29 of the memory chip pair 23 receives a number of commands from the flash system logic circuit 22. These may be categorized as read commands, write commands, and memory system maintenance commands. The read commands are executed within the chip pair 23 entirely under control of the interface 29. The write commands and many of the maintenance commands are executed by the interface 29 using the write state machine 30. This is especially true in embodiments in which the write state machine 30 includes a programmable microcontroller.

As is shown in FIG. 3, the array 21 is divided into a plurality of blocks of memory. In general, a flash EEPROM memory array is divided into blocks which are connected so that each entire block of memory cells must be erased simultaneously. With N-type complimentary metal-oxide-silicon (CMOS) memory devices, this erasure is typically accomplished by a high voltage value applied simultaneously to the source terminals of all the memory transistors of a block while the gate terminals of the devices are grounded and the drain terminals are floated. Such an erasure places each of the devices of the block into the erased condition. When in the erased condition, a device may be programmed to place a particular charge level on the floating gate. Historically, only one charge level greater than the erased level was utilized; and this level has been referred to as a "zero" or programmed condition. The erased state has been referred to as a "one" or erased condition. A device used to store charge at only these two charge levels is capable of storing a single bit of data. More recently, it has been found that a number of levels of charge greater than the erased level may be stored on the floating gate of a flash EEPROM device. With three charge levels above the erased level, a device can store two bits of data.

Whether one or more bits are stored by a device, since all of the source terminals of the memory transistor devices of a block of the array are joined together, a device in a charged state cannot be switched to the erased state until the entire block of the array is erased once again. Thus, while an electro-mechanical hard disk drive typically stores information in a first area of the disk and then rewrites that same area of the disk when the information changes, this is not possible with a flash EEPROM memory array without erasing all of the valid information that remains in that portion of the array along with the invalid information. Consequently, in some arrangements, when the information at a data entry changes, the changed information is written to a new location on a block of the array containing empty (erased) cells rather than written over the old data; and the old data is marked as invalid. Then, after a sufficient number of cells on a block have been marked invalid, the entire block is erased. Typically, a flash array writes data to be stored in the array to some block of the array which contains erased cells. The write operation progresses sequentially into the block with empty cells until the block has been filled with data.

Because of this arrangement by which data is replaced, each block of the array will after some time have a number of entries which are marked as invalid and cannot be used for storage. Consequently, the array fills with data as the data previously stored is changed; and a point will come when it is necessary to clear the invalid information from a block in order to provide space for new or changed information to be stored. When erasure of a block occurs, all of the remaining valid data stored in the block to be erased is written to a new block; the space from which the data was read is marked invalid; and then the entire invalid block is erased and put back into use as a clean block of memory.

It typically takes as much as a second to erase a block of an advanced flash EEPROM array. However, because erasure need not occur with each entry which is rewritten, erasure may be delayed until a block contains a sufficient amount of invalid information that cleanup is feasible. This reduces the number of erasure operations to a minimum and allows erasure to occur in the background when the facilities for controlling the array are not otherwise occupied with reading and writing.

Because of this arrangement by which data is replaced in the array by writing it to a different physical position, the physical address at which data is stored varies constantly. To indicate where specific data is stored, a logical address is assigned to and accompanies the data. Depending on the system implementation, this logical address may be the same address as is used by the host computer. The controller then searches for each logical address when the data in the array 10 is accessed.

Figure 4:
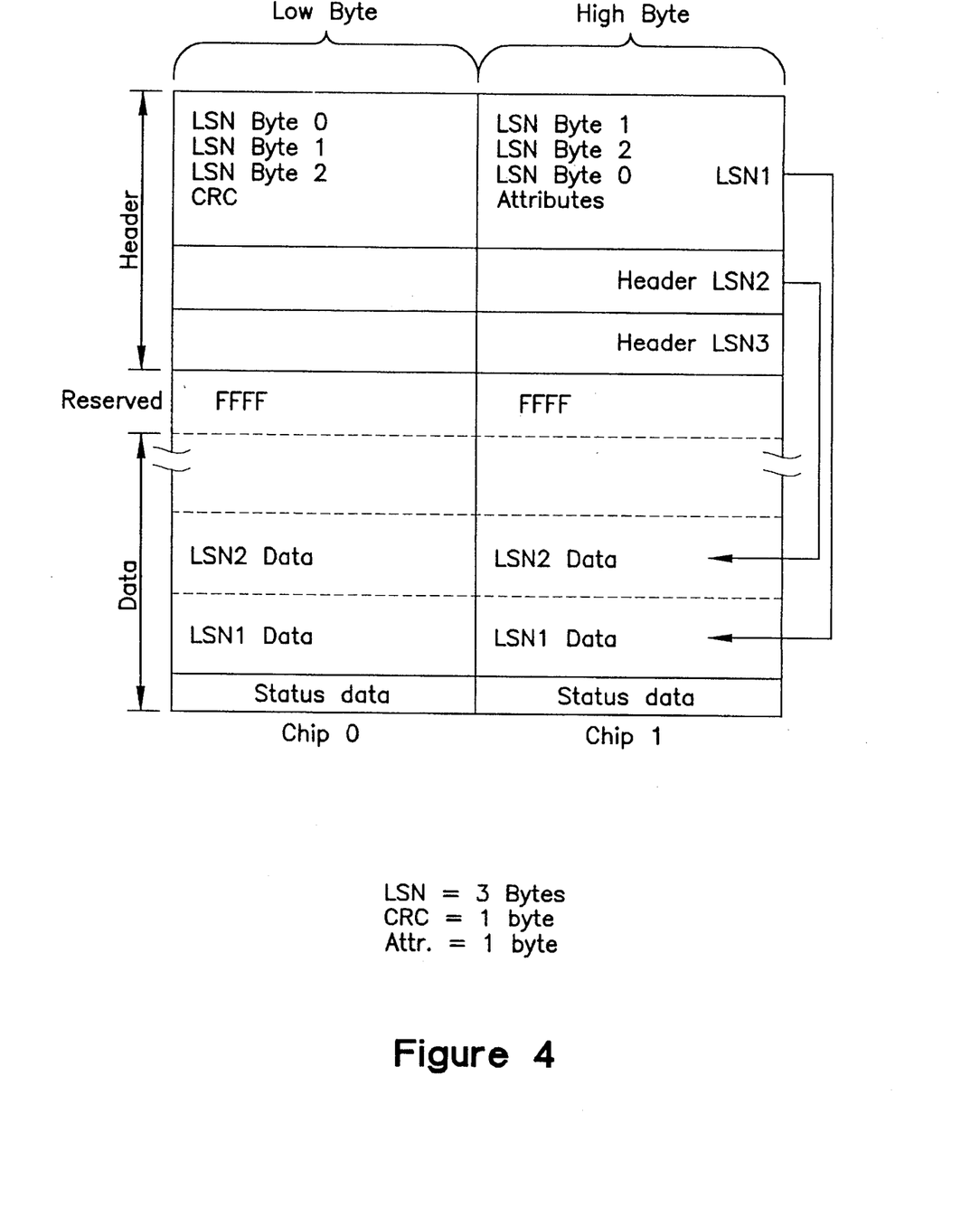
FIG. 4 is a diagram illustrating the arrangement of control information and data in a single block of a memory array constructed in accordance with the present invention.

FIG. 4 is an idealized drawing which illustrates one embodiment of an individual block of the array and is useful in describing the way data is stored. A typical block is illustrated as a large rectangular area. The area of the block is physically positioned on portions of two individual physical chips in one embodiment. One of these chips stores all of the low byte data for all of the blocks while the other chip stores all of the high byte data for all of the blocks. In one embodiment, each chip has its own individual control circuitry including a separate control user interface 29 and a separate write state machine 30. The area assigned on each chip for one block of the array includes a plurality of transistor devices typically arranged in rows and columns to provide the desired storage. The individual transistors and the various column and row select lines and other conductors for operating the block are not illustrated in FIG. 4 but are well known to those skilled in the art of designing flash EEPROM memory arrays.

As may be seen in FIG. 4, information is stored in each chip of the block 50 beginning at the top of the block and continuing to the bottom. At the top of each chip of the block 50 are identification fields which are referred to as "headers." These identification fields store data including the logical addresses for the data. For example, in one embodiment, a logical address is stored as three bytes in the header portion of the lower byte chip as a part of the first header at the top. In the figure, the logical address of the first data set stored in the first header is shown as "LSN1" although it might be any number within the range of the array. In one embodiment, the logical address used is a sector number similar to the sector numbers uses in addressing magnetic media such as electromagnetic hard disk drives and refers to a number of cells capable of storing an equivalent amount of data. In the header with the logical address on the lower byte chip may be stored a one byte cyclical redundancy check (CRC) value computed by cyclical redundancy hardware (or software) as the header is written to the block. The same logical address is stored as three bytes arranged in a different order in the header portion of the high byte chip along with a set of attributes. These attributes include bits indicating whether data is stored in the data area below the header, whether the data is to be considered bad and unusable, a revision number, and the mode of storage. These fields allow the accurate retrieval of the data set.

A technique used to detect errors with flash EEPROM arrays is called a cyclical redundancy check (CRC). A cyclical redundancy check uses a math function to compute a value which is unique to the data stored during storage of the data and stores that value with the data. When the data is to be read, a new CRC value is computed from the data and compared to the CRC value stored with the data. If the values are not equal, some change has occurred in the data since it was stored. This cyclical redundancy check detects errors but does not correct errors which it detects.

Immediately below the first header are stored header data for each of the other data sets stored on the particular block of the array. Typically, up to five hundred or more data sets are stored in a block of the array. Below the portion of the block including the headers are stored the data sets for each of the logical addresses with headers at the top. In one embodiment, the data for logical address LSN1 is stored at the bottom (in the figure) of the data portion of the block. Then the data for the next header from the top (logical address LSN2) is stored next above the data for logical address LSN1. This format continues throughout the block. Arrows in FIG. 4 illustrate the physical position at which the data for each of the logical addresses is stored. In the case of logical address LSN1, which is the first address on the block, the data is written in a position at the bottom of the entire data storage area. FIG. 4 also shows a second arrow from the header for the logical address labeled LSN2 to a physical position on the block which stores the data for logical address LSN2. As may be seen, since the data sets for the headers stored above are written from the bottom of the block up, an erased area is left between the headers and data which is erased so if read produces all "one" values which may be interpreted as the hexadecimal values FF, FF. These values may be used in managing the array.

At the very bottom of the block is stored additional status information useful in maintaining the array. In this area may be stored an indication referred to as "questionable" which indicates whether problems have occurred in accessing the block and suggests that the block may be bad and should be removed from service.

The manner in which the array is accessed during read and write operations in single bit mode may be understood by considering FIGS. 2, 3, and 4. Before use, each of the blocks of the array is formatted to contain a header, empty storage space for each data set which the block is able to store, and a status area. Most of these data sets in the array 31 are numbered when initially formatted with logical addresses in serial order, but a few blocks are formatted as unused and have no logical address information in the header areas. Consequently, the individual data sets within the flash chip pairs 23 will have logical addresses and space for data whenever a read or a write operation is begun. In a read operation it is necessary to find the physical location of the data set in order to read the data stored in the array. In a write operation, it is necessary to find the physical location of the data set so that the header corresponding to the old data at this position may be invalidated while the new data is written to a new physical position which receives the same logical address. In either a read or a write operation, a command indicating the operation to be accomplished and the logical address are furnished so that a search may be conducted. In one embodiment, when data is to be written to the array 31, the data is furnished to the page buffers 44 of the chip pair 23. The data in the page buffer is written to an unused data area of a block having empty space. The header area of this unused data area is written by the microprocessor 28 using the write state machine 30 with the logical address. The microprocessor 28 uses the header data to compute a CRC value and uses the write state machine 30 to store the CRC in the header.

With either a read or a write operation, the command word is also furnished to the interface 29 to be used in a search for the data set being updated. This command word includes information regarding a search for the header including whether one or two words are sought, whether the search is in single-bit or multi-bit mode, and how many words to increment. The interface 29 causes a search for the data set in the array to be conducted using the data comparator 48 by searching each block from the top of the header area and continuing down. In an embodiment in which the CRC is stored with the logical address, the search continues until the logical address and CRC are found or are found to be absent from the block as is signified by the return of a data value "FF, FF" from the area immediately below the header area of the block. In an embodiment in which no CRC is included, the search continues until the logical address is found or is found to be absent from the block in the same manner. The interface 29 uses the circuitry of the data comparator 48 to rapidly compare an address furnished with any command to the chip pair 23 with the addresses on each block of the chip pair sequentially so that a logical address may be rapidly located.

When the logical address is found on a block, the block and offset on the block of the header are transferred back to the page buffer with an indication that the location of the header for the logical address has been found. For a read operation, the interface 29 uses this address to accomplish the read operation. For a write operation whether an initial write or an update of data, the write state machine 30 looks for the indication that the header has been found and uses the address to determine where the data set is stored in the array 31. Since the new data has been furnished to an unused portion of the flash array and a new header constructed, the write state machine 30 marks the header associated with the old data found on the block as invalid once the new data has been safely stored.

This operation occurs each time data in a particular data set is changed. The logical address (and CRC if included) is furnished to the page buffer 44 using the input address buffer 37. The interface 29 conducts a search to find the physical position of the header. The attributes of the header are checked to determine whether the block has been marked as bad, and the header and new data are written by the write state machine 30 to erased cells somewhere on one of the blocks of the array 31. Once this has occurred, the old header is marked invalid; in one embodiment, this is accomplished by writing the first two words of the logical address to zero on each of the chips of the block.

When data is to be read, the logical address is furnished to the page buffer (along with the CRC value computed from the logical address, if the CRC is also stored). The search is conducted for the logical address (and a CRC value). If the logical addresses (and CRC values) compare, the data is valid and may be read. If these do not compare, the search will not find the header; and the search will ultimately return a "not found" indication. In a later cleanup operation, the CRC value will fail; and the header will be marked invalid.

In one embodiment, when data is to be written to the array 31, the data is furnished to the page buffers 44. A starting address for the data to be written is furnished to the page buffers 44 of the low byte chip of the array 31. The data in the page buffer is written to the data area of a block having empty space. The header area of this unused data set is written by the microprocessor 28 using the write state machine 30 in the next available header location. The microprocessor 28 uses the header data to compute a CRC value and stores that in the header.

Whenever a header is marked invalid after the data has been written to a new area, the invalid data set is left to be cleaned up at some later time when a sufficient number of headers on the block have been marked as invalid. Because the space marked invalid on a block cannot be released for use until the entire block is erased, each block of the array will after some time have a number of entries which are marked invalid and cannot be used for storage. Thus, the amount of invalid space in the array will mount as the array is used to store data. After some period of time, a sufficient number of blocks will be filled that it will be desirable to release space by moving the valid information from some especially dirty block to some other block and erasing the entire block from which the valid information has been removed. The process of writing valid data to other blocks and erasing a dirty block is referred to as "cleaning up a block" and has the effect of freeing an additional amount of flash memory equal to the amount of the flash memory on the erased block which has previously been marked as invalid.

An arrangement has been devised which allows the individual memory cells of a flash EEPROM memory array to be operated in either single or multi-bit mode. The essence of such an arrangement is the provision of a first reference cell which is arranged in a circuit similar to the circuit of each bitline. The charge value stored by the reference cell is compared by a sense amplifier to the charge value stored by any selected memory cell. If the charge stored by the memory cell is less than that stored by the reference cell, the sense amplifier provides an output signal to indicate that the cell is erased. If the charge stored by the memory cell is greater than that stored by the reference cell, the sense amplifier provides an output signal to indicate that the cell is programmed.

In its simplest form, the arrangement also includes a second plurality of reference cells each of which stores a charge at a different level from the first level, e.g., one higher level and one lower level. The charge stored by any memory cell may be compared by sense amplifiers to each of these reference levels to determine the level of charge stored by the memory cell. In one embodiment, three reference levels are provided so that four different charge levels on the floating gate of a memory cell may be sensed.

When a memory device is being written, the sense amplifiers test whether the charge on the floating gate of the memory device has reached a correct level compared to the desired reference level, and charging continues until the correct reference level is reached. When reading, the memory device charge level is compared to one or more of the reference cell levels depending on whether the mode is single bit or multi-bit.

In order to operate the array in single bit mode, a signal is provided to switch the first reference cell into operation. In order to operate the array in multi-bit mode, a signal is provided to switch the second set of a plurality of reference cells into operation. In one embodiment, this signal is a configuration command which occurs at various instances during the read, write and other operations in response to the programs for accomplishing these operations which are stored in ROM 27 and are executed by the microprocessor 28. The microprocessor 28 responds to these configuration commands by transferring the configuration commands to the command user interface 29 of the appropriate flash chip pair 23; the interface 29 causes the flash chip pair 23 to function in single bit or multi-bit mode.

Figure 5:
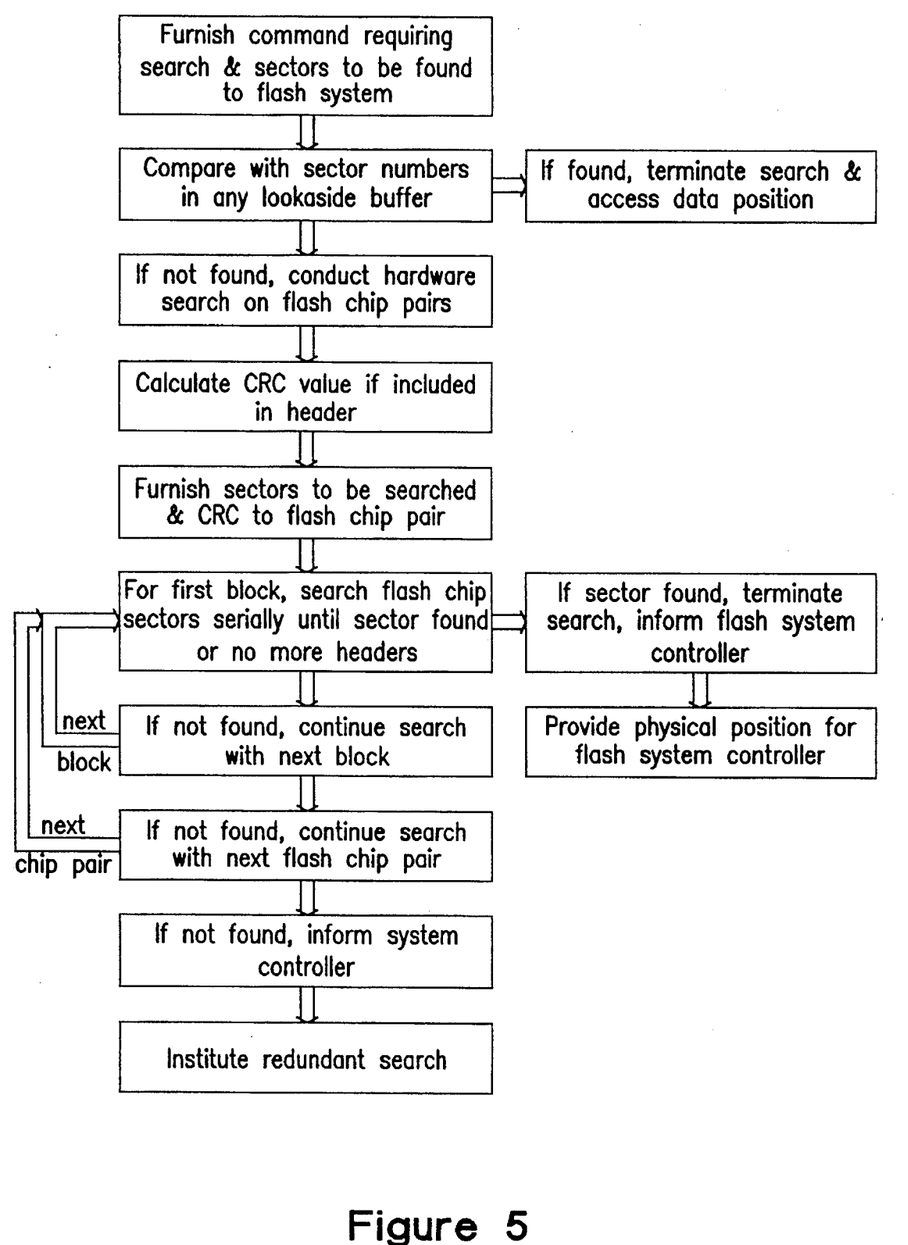
FIG. 5 is a flow chart illustrating a method in accordance with the present invention.

FIG. 5 is a flow chart illustrating the operation of the invention in locating headers in a block of the array in accordance with the present invention. As has been pointed out above, the individual physical data sets within the flash chip pairs will have logical addresses and space for data whenever a read or a write operation is begun. In a read operation, it is necessary to find the header in order to read the data stored in the data set. In a write operation, it is necessary to find the header so that the old data may be invalidated while the new data is written to a new physical position which receives the same logical address. The specific manner in which such a search is conducted is described hereinafter.

When a host desires to read or write to the array, a command is provided by the host on the system bus 12 and transferred to the logic circuit 22 of the flash system 16. This command is transferred to a task file in the microprocessor 28 of the system 16. The microprocessor 28 is interrupted and commences carrying out the command. The command includes the address which is being sought and the number of data sets included in the read or write operation. The microprocessor 28 reads the command and compares the logical address with logical addresses stored in a lookaside buffer kept in RAM 26 of the system 16 for a match. This lookaside buffer stores logical addresses along with chip, block, and offsets at which the data sets reside for each of some number of last-accessed logical addresses. If there is a hit in the lookaside buffer, the search is complete. One embodiment of the invention utilizes a buffer (comprised of RAM) included as a part of the logic circuit 22. If the command is for a read operation, the data at the chip, block, and offset of the flash chip pair is read into the buffer of the logic circuit 22 so that it may be used by the host. If the operation is a write, the header is found at the chip, block, and offset of the flash chip pair 23 so that the data set may be invalidated, and data in the buffer is written to the new location.

Typically, the lookaside buffer provides a hit over ninety percent of the time so that a further search is not necessary. However, presuming the logical address is not found, a hardware search is conducted for the logical address. In order to accomplish this, the microprocessor 28 undertakes a software process which begins (when a CRC is used) with the calculation of a CRC value from the bytes of the logical address. The search for the logical address is conducted using the logical address and the CRC value so that both the header and its validity are determined at the same time. The logical address and the CRC value are written into the page buffer 44 of a first chip pair 23 or all of the page buffers of all of the chip by the microprocessor 28 along with data from the process being run by the microprocessor 28 describing any blocks in the array by chip and block number such as bad blocks which should be skipped in the search and a command "go hardware search" along with the configuration of the search. The configuration tells the chip or chips to search in single bit mode and includes a starting block number. The starting block number is typically the first block on a chip.

At this point, the microprocessor 28 is disabled by the logic circuit 22 until the search is completed. The search itself may be conducted either serially through the flash chip pairs 23 or in all pairs at once. In a serial search, the microprocessor 28 transfers the command data to a first flash chip pair 23, the search is conducted in that pair, and the result is sent to the page buffer of the flash chip pair. The result of a search is stored in the page buffer of the chip pair 23. The result is a code which indicates whether the search was successful or unsuccessful and the block and offset value if the search was successful. The completion of the search in a chip pair 23 generates an interrupt to the microprocessor 28 which looks at the data in the page buffer of the flash chip pair to see whether the search was successful. If the search was unsuccessful, the search continues in the same manner with the next chip pair when the search is serial.

If the search is successful, the chip number is known to the microprocessor 28 which started the search, and the block and offset values are found in the page buffer of the chip pair 23. The microprocessor 28 uses these values to find the data set header on the chips. The microprocessor 29 reads the header data to determine that the data set has not been marked bad. In the case of a read operation, the data may then be read by the microprocessor 28 into the buffer of the logic circuit 22 so that it may be used by the host. In the case of a write operation, the header data may be invalidated after the new data and header are written to a new position in the array.

When the chip pair 23 receives the logical address and CRC value for which to search and the block number at which to start the search, the search is conducted under control of the command user interface using the data comparator 48. The data comparator 48 is designed in one embodiment to compare two words furnished to it (e.g., the three bytes of the logical address and one byte of CRC value) with the values stored in each header in each block on the chip pair. It does this by starting at the top of each block in the low byte chip beginning with block 0 and serially stepping through each header to compare the logical address and CRC value with the value furnished by the microprocessor 28 and stored in the page buffers 44. The use of the low byte chip limits the search which needs to be conducted; the logical address on the high byte chip provides redundancy so that an unsuccessful search on the low byte chips due to a data error in a low byte chip header may be overcome. The data comparator 48 searches until a comparison is found or the doubleword FF, FF is found. If a header comparison is successful, the block and offset are transferred to the page buffers 44. This causes an interrupt to be generated to the microprocessor 28 so that it may treat the header discovered in the manner required by the command to the system 16. If a comparison on a block is unsuccessful and the value FF, FF is reached, the data comparator moves to the next block and continues the search. If a search of the entire chip is unsuccessful, the data comparator causes an unsuccessful indication to be stored in the page buffer 44, and the command user interface generates an interrupt to the microprocessor 28. The microprocessor 28 responds to this interrupt, determines whether the search was successful or not by reading the page buffer 44 of the chip, and continues a serial search by going to the next chip pair 23. If a search of all the chip pairs is unsuccessful, the redundant logical address allows a search of the high byte chips to be conducted to overcome any device errors.

With a parallel search, the microprocessor 28 causes the search command with the logical address and the CRC value to be sent to all of the chip pairs simultaneously so that each conducts a search simultaneously. In one embodiment, the first chip pair 23 to finish a successful search will return an interrupt to alert the microprocessor 28 to the successful search completion. When a successful search is completed, the searches on other chip pairs 23 are terminated. Alternatively, any completed unsuccessful search will generate an interrupt to the microprocessor 28 to indicate that the header has not been found.

Figure 6:
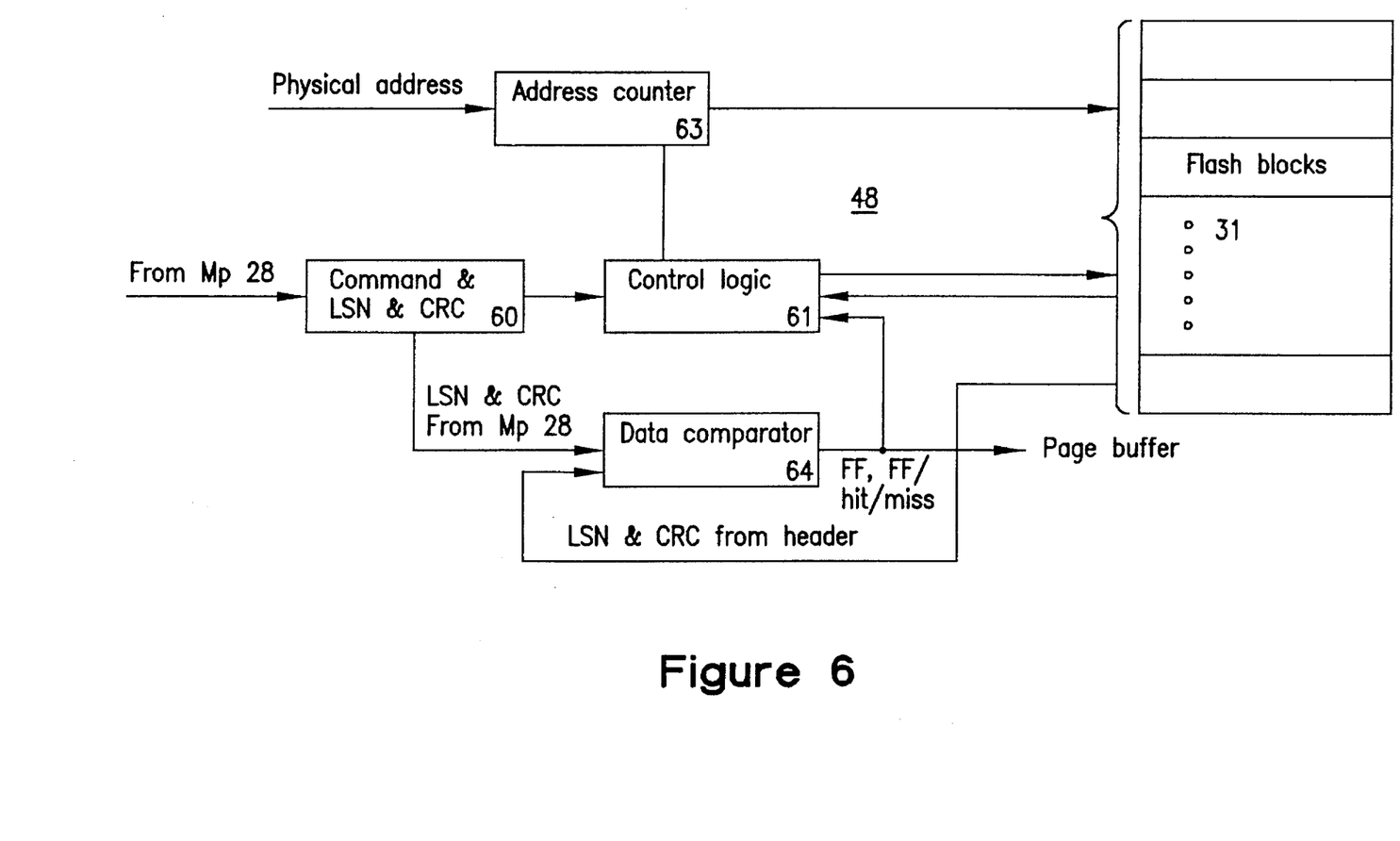
FIG. 6 is a block diagram illustrating a detail of the circuit of FIG. 3.

FIG. 6 is a block diagram of a data comparator 48 which may be used with the present invention. As may be seen, the command, logical address, and CRC value are received and latched at 60. Using this data, control logic 61 starts an address counter 63 which cycles through the header addresses in each sequential block of the low byte chip of the chip pair. The control logic causes a read operation of the header logical address and CRC value at each address. The logical address and CRC values are furnished to a data comparator 64 which furnishes signals indicating a comparison of addresses, a comparison with the data FF, FF, or a miss. Miss signals are transferred back to the control logic 61 and to the counter 63 to continue the count. The results are transferred to the page buffers 44 for use by the microprocessor 28.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A circuit for searching for data patterns in a memory array, the memory array having a plurality of chips of non-volatile memory cells arranged in blocks which are erasable as a group, the blocks of memory cells being adapted to store data in sets each including a logical address identification, the circuit comprising:

a processor for generating commands for controlling the operation of all of the chips;

a command interface on each chip for receiving commands from the processor, for issuing commands to control functions of that chip, and for responding to results of commands issued; and search logic on each chip, adapted to respond to commands from the command interface, for comparing logical address identification data stored in the blocks of the chip with address data furnished to the command interface and for determining whether the addresses match.

2. A circuit for searching for data patterns in a memory array as claimed in claim 1 wherein the search logic comprises:

a logic circuit for controlling an order of a search;

a circuit which stores a physical address being compared in a block during the search; and a comparator for comparing logical address identification data to address data furnished for the search.

3. A circuit for searching for data patterns in a memory array as claimed in claim 2 wherein the logical address identification data includes error detection data.

4. A circuit for searching for data patterns in a memory array as claimed in claim 1 wherein the command interface is adapted to respond to commands from the processor to read data stored in a data set for which a search has provided a physical position of the data set.

5. A circuit for searching for data patterns in a memory array as claimed in claim 1 further comprising:

a write state machine, coupled to the command interface for controlling writing of data to blocks of memory devices; and wherein the command interface is adapted to respond to commands from the processor to write data to an empty portion of the memory array for which a search has provided a physical position of a data set and indicate that the data at the physical position of the data set is invalid.

6. A circuit for searching for data patterns in a memory array as claimed in claim 1 wherein the processor is for generating search commands to all of the plurality of chips simultaneously.

7. A circuit for searching for data patterns in a memory array as claimed in claim 1 in which each of the plurality of chips of non-volatile memory cells comprises a plurality of flash EEPROM memory devices.

8. A computer system comprising:

a central processor;

main memory;

a bus, coupled to the central processor and the main memory, for transferring data; and a flash EEPROM memory array, coupled to the bus including:

a plurality of chips of flash EEPROM memory devices arranged in blocks which are erasable as a group, and a circuit for searching for data patterns in the flash EEPROM memory array comprising, a processor for generating commands for controlling the operation of all of the chips, a command interface on each chip for receiving commands from the processor, for issuing commands to control functions of that chip, and for responding to results of commands issued, and a hardware search engine on each chip, adapted to respond to commands from the command interface, for comparing logical address identification data stored in the blocks of the chip with address data furnished to the command interface and for furnishing a physical position of a data set corresponding to the address data to the command interface if the logical address identification data matches the address data.

9. A computer system as claimed in claim 8 wherein the hardware search engine comprises:

a logic circuit for controlling an order of a search;

a circuit which stores a physical address being compared in a block during the search; and a comparator for comparing logical address identification data stored to address data furnished for the search.

10. A computer system as claimed in claim 9 wherein the logical address identification data includes error detection data for the logical address identification data being compared.

11. A computer system as claimed in claim 8 wherein the command interface is adapted to respond to commands from the processor to read data stored for which a search has provided a physical position of a data set.

12. A computer system as claimed in claim 8 further comprising;

a write state machine, coupled to the command interface, for controlling writing of data to blocks of the memory devices; and wherein the command interface is adapted to respond to commands from the processor to write data to an empty portion of the memory array for which a search has provided a physical position of a data set and indicated that the data at the physical position of the data set is invalid.

13. A computer system as claimed in claim 8 wherein the processor is capable of generating search commands to all of the plurality of chips simultaneously.

14. A method of searching a memory array, the memory array including a plurality of chips of non-volatile memory devices arranged in blocks, the method comprising the steps of:

(a) initiating a command from a central control for all of the chips, the command including a first logical address for which a physical position is to be retrieved;

(b) transferring the command to a circuit on a first chip of the plurality of chips;

(c) the circuit comparing the first logical address with a plurality of logical addresses stored in blocks on the first chip; and (d) providing the physical position for the first logical address if the first logical address matches one of the plurality of logical addresses stored in a block on the chip.

15. A method of searching a memory array as claimed in claim 14 wherein the first logical address is stored with an error detecting value;

further comprising a step of generating an error detecting value from the first logical address; and wherein the comparing step (c) includes comparing both the generated error detecting value and the stored error detecting value.

16. A method of searching a memory array as claimed in claim 14 further comprising a step of returning the physical position for the first logical address to a controller on the chip for initiating an operation with respect to data stored at the physical position.

17. A method of searching a memory array as claimed in claim 16 further comprising a step of initiating a write operation which writes new data to an empty portion of the memory array and invalidates data stored at the physical position.

18. A method of searching a memory array as claimed in claim 16 further comprising a step of initiating a read operation to retrieve data stored at the physical position.

19. A method of searching a memory array as claimed in claim 14 in which the initiating step (a) includes a step of sending the command to each of the plurality of chips simultaneously.

20. A method of searching a memory array as claimed in claim 14 wherein the initiating step (a) includes a step of sending the command to each of the chips serially until the physical position is retrieved or the search fails.

21. A circuit for searching for data patterns in a memory array, the memory array having a plurality of chips of non-volatile memory cells arranged in blocks, the blocks of memory cells being adapted to store data in sets each including a logical address identification, the circuit comprising:

means for generating commands for controlling the operation of the plurality of chips;

means for receiving commands from the means for generating commands;

means for issuing commands to control functions of that chip;

means for responding to results of commands issued;

means for comparing, situated on each chip, logical address identification data stored in the blocks of the chip with address data furnished to the means for receiving; and means for determining, situated on each chip, whether the addresses match.

22. A circuit for searching for data patterns in a memory array as claimed in claim 21 wherein the means for receiving includes means for responding to commands from the means for generating when read data stored in a data set for which a search has provided a physical position of the data set.

23. A circuit for searching for data patterns in a memory array as claimed in claim 21 wherein the means for generating is for generating search commands to each of the plurality of chips simultaneously.

* * * * *